(12) United States Patent  
Ma et al.

(10) Patent No.: US 6,737,754 B2
(45) Date of Patent: May 18, 2004

(54) COF PACKAGED SEMICONDUCTOR

(75) Inventors: Qing Ma, San Jose, CA (US); Jin Lee, Palo Alto, CA (US); Chun Mu, Saratoga, CA (US); Quat Vu, Santa Clara, CA (US); Jian Li, Sunnyvale, CA (US); Larry Mosley, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 295 days.

(21) Appl. No.: 09/777,833

(22) Filed: Feb. 5, 2001

(65) Prior Publication Data

US 2002/0185745 A1 Dec. 12, 2002

Related U.S. Application Data

(62) Division of application No. 09/407,801, filed on Sep. 28, 1999, now Pat. No. 6,238,954.

(51) Int. Cl.[7] ............................................. H01L 23/28
(52) U.S. Cl. ....................... 257/796; 257/707; 257/712; 257/713
(58) Field of Search ........................ 257/675, 704–707, 257/712, 713, 718–720, 796

(56) References Cited

U.S. PATENT DOCUMENTS

| | | | | |
|---|---|---|---|---|
| 4,667,219 A | * | 5/1987 | Lee et al. | 257/693 |
| 5,483,098 A | | 1/1996 | Joiner, Jr. | |
| 5,705,851 A | | 1/1998 | Mostafazadeh et al. | |
| 5,729,052 A | * | 3/1998 | Tonti et al. | 257/712 |
| 5,909,056 A | * | 6/1999 | Mertol | 257/704 |
| 5,923,083 A | * | 7/1999 | Autry et al. | 257/688 |
| 6,201,707 B1 | * | 3/2001 | Sota | 361/761 |
| 6,271,585 B1 | * | 8/2001 | Osada et al. | 257/712 |

* cited by examiner

Primary Examiner—Nathan J. Flynn
Assistant Examiner—Leonardo Andujar
(74) Attorney, Agent, or Firm—Mark V. Seeley

(57) ABSTRACT

A semiconductor device having a multilayer laminate that includes a thermally stable, flexible polymer film, a semiconductor die, a molding compound, and a heat dissipation member. The die has an active surface and an inactive surface, in which the active surface includes a plurality of contacts. The molding compound contacts both the laminate and the die, but does not contact the die's active or inactive surfaces. The heat dissipation member contacts the die's inactive surface.

7 Claims, 2 Drawing Sheets

COF PACKAGED SEMICONDUCTOR

This is a Divisional Application of Ser. No. 09/407,801 filed Sep. 28, 1999, now U.S. Pat. No. 6,238,954 issued on May 29, 2001.

FIELD OF THE INVENTION

The present invention relates to packaged semiconductors. More specifically, the invention relates to a chip-on-flex ("COF") packaged semiconductor device that can effectively dissipate heat generated by an enclosed die.

BACKGROUND OF THE INVENTION

Because COF packaging enables a semiconductor die to be bonded directly to a multilayer laminate, it has become a key downsizing technology for semiconductor devices. Attaching the die to such a laminate facilitates short lead lengths and a flexible interconnect. Because COF technology requires less space for the I/O interconnects, it minimizes the resulting device's footprint. Driven by the need for miniaturization and flexibility, COF packaging techniques have been adopted for components used in electronic devices such as cameras, pagers, disk drives, LCDs, printers, smart cards, hearing aids and other devices where form factor constraints may be severe.

Although COF packaging technology is currently used for relatively small die with low power requirements, it is not particularly suitable for large, high power die—e.g., a microprocessor die. The large mismatch between the coefficients of thermal expansion ("CTE") of such a die and the molding compound that encapsulates it can create significant stress and warpage, which can cause reliability failures and processing difficulties. In addition, a highly powered die generates significant heat that must be dissipated to maintain an acceptable servicing temperature. Because COF packaging encloses the back side of the die with the molding compound, such packaging does not efficiently conduct heat.

Accordingly, there is a need for an improved COF packaged device that does not sustain severe stress or warpage caused by large CTE mismatch between the die and the molding compound. In addition, there is a need for such a device that may effectively transfer heat from the die.

SUMMARY OF THE INVENTION

An improved semiconductor device is disclosed. That device includes a multilayer laminate made from thermally stable, flexible polymer film and a semiconductor die that contacts the laminate. The device also includes a molding compound—which contacts both the laminate and the sides of the die, but not the die's top or bottom surface—and a heat dissipation member that contacts substantially all of the die's top surface.

DETAILED DESCRIPTION OF THE PRESENT INVENTION

A semiconductor device is described that includes a unique packaging structure. In the following description, numerous specific details are set forth such as material types, dimensions, etc., to provide a thorough understanding of the present invention. However, it will be apparent to those skilled in the art that the invention may be practiced in many ways other than those expressly described here. The invention is thus not limited by the specific details disclosed below.

Figure 1:
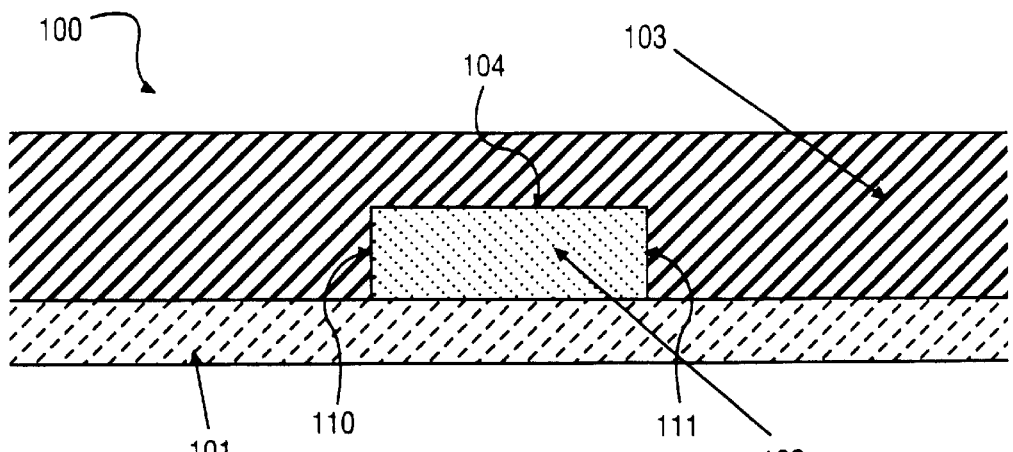
FIG. 1 represents a cross-section of a semiconductor device that has a COF package structure.

FIG. 1 represents semiconductor device 100 that includes COF packaging. That structure includes multilayer laminate 101 (which may be referred to as a "build up layer"), die 102, and molding compound 103. Die 102 is attached to laminate 101 in the conventional manner. Molding compound 103 encapsulates die 102 to protect it from the environment. In addition, molding compound 103 provides structural support for laminate 101. The device's significant feature, for the purpose of appreciating the present invention, is that molding compound 103 covers both back 104 and sides 110, 111 of die 102, subjecting it to CTE mismatch between the die and the molding compound and inhibiting effective heat transfer from the die.

Figure 2:
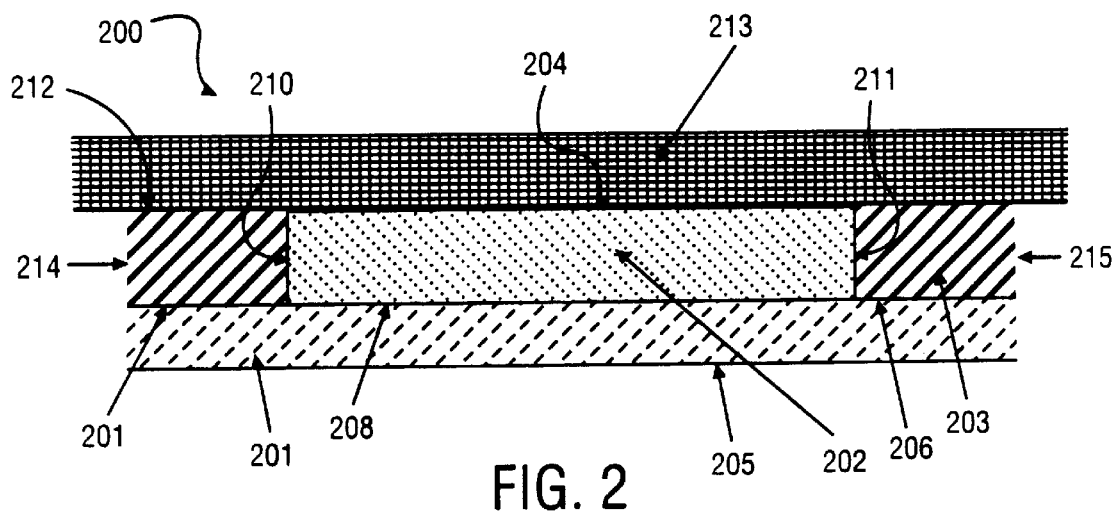
FIG. 2 represents a cross-section of a first embodiment of the semiconductor device of the present invention.

FIG. 2 represents a first embodiment of the semiconductor device of the present invention designed to address those problems by ensuring that substantially none of the molding compound contacts the back side of the die. Like the device shown in FIG. 1, device 200 includes laminate 201, die 202, and molding compound 203. Unlike the FIG. 1 structure, however, molding compound 203 does not contact back side 204 of die 202. As a result, CTE mismatch between die 202 and molding compound 203 should not stress the device or cause it to warp.

When device 200 has a COF package structure, laminate 201 preferably comprises multiple layers of thermally stable and flexible polymer film, as is conventionally used to make this type of package. Laminate 201 has top surface 206 and bottom surface 205. In addition to including vias filled with conductive material, e.g., copper, for contacting bond pads (not shown) located on bottom surface 208 of die 202, laminate 201 will provide the interconnect structure (not shown) that connects die 202 to solder balls (not shown), which are attached to bottom surface 205. As will be apparent to those skilled in the art, laminate 201 may be formed by successively depositing onto a support structure (not shown) multiple films that have various interconnect, via and/or contact features—until laminate 201 obtains the desired configuration.

Laminate 201 preferable comprises film having a $T_g$ greater than 150° C. and a CTE less than 70 ppm/° C. over a range of temperatures between 25° C. and 230° C. (e.g., a temperature range between room temperature and a temperature that may be applied to bond device 200 to a printed circuit board). Polyimide based films, such as those available from E. I. du Pont de Nemours and Company under the tradename Kapton®, are particularly preferred materials for making the film used to make laminate 201. In a preferred embodiment, laminate 201 has a substantially square shape that is between about 20 mm and about 50 mm on each side.

Die 202 may be any type of semiconductor die used to make integrated circuits. The packaging techniques of the present invention, however, should be particularly useful when die 202 is a relatively large, high power die—such as a microprocessor die—that will be enclosed in a COF package. Such a die may have a surface area that exceeds 100 mm² and draw well over 15 watts, when fully powered. In the embodiment shown in FIG. 2, die 202 has top surface 204 and bottom surface 208, bottom surface 208 contacting laminate 201's top surface 206. Die 202 also has substantially vertical first and second sides 210, 211, which are each oriented substantially perpendicular to top and bottom surfaces 204, 208. Bottom surface 208 provides die 202's active surface (i.e., the surface that includes the contacts); whereas, top surface 204 provides the die's inactive surface (i.e., the surface without contacts). In this respect, device 200 may be referred to as a "flip chip-on-flex" device. "Top surface," as used herein, refers to the "back side" of the die, i.e., the side that does not contact the laminate. Die 202 preferably comprises silicon, and may be of various shapes, generally, square or rectangular.

Molding compound 203 may comprise one of the various substances used to make such materials for semiconductor packages. Thermosetting plastics are particularly preferred, e.g., phenolic epoxy, an epoxy novolac resin, or other epoxy molding compounds (some which may contain silicon dioxide) like those available from Amoco Chemical Company under the Plaskon® tradename. As shown in FIG. 2, molding compound 203 has first surface 209, which contacts laminate 201, and second surface 212. Molding compound 203 also contacts sides 210, 211 of die 202, but not die 202's top or bottom surfaces 204, 208.

In the embodiment of the present invention shown in FIG. 2, molding compound 203 and die 202 have approximately the same thickness, which enables heat dissipation member 213 to contact both surface 212 and substantially all of top surface 204. Molding composition 203 further includes first end 214 and second end 215, each oriented substantially perpendicular to first and second surfaces 209, 212, and each preferably coterminous with the ends of laminate 201. As shown, heat dissipation member 213 is longer than the distance between end 214 and end 215. In a preferred embodiment of the present invention, heat dissipation member 213 has a length that is equal to or greater than that distance. Regardless of the shape of device 200, whether a conventional square or rectangular shape or perhaps an unconventional circular or irregular shape, heat dissipation member 213's surface area preferably should equal or exceed molding compound 203's surface area.

Heat dissipation member 213 may be any type of device used to transfer heat from a die to the ambient or a cooling device. Such devices include various heat spreaders or heat sinks, which may be made from materials having high thermal conductivity such as copper or aluminum. In the resulting device 200, there is no molding compound on top surface 204, and molding compound 203 and die 202 have substantially the same thickness. This design enables heat dissipation member 213 to be substantially flat and to connect directly to die 202, which ensures that thermal mismatch induced stresses (and any accompanying warpage) will be largely avoided.

If die 202 and heat dissipation member 213 have CTEs that differ significantly, member 213 should not be attached to die 202 in a mechanically rigid fashion. Instead, these components should be loosely coupled to ensure that possible stress due to thermal mismatch, which might otherwise result from their attachment, is avoided. In such circumstances, member 213 may be secured to die 202 with a clip (which permits slight expansion of member 213), after a thermal grease is applied to surface 204 of die 202. Alternatively, a thin layer of a thermally conductive adhesive may be used to bind member 213 to die 202. Certain phase transformation materials, which are relative hard at lower temperatures, but become relatively soft at higher temperatures, may be employed for that purpose. If the CTEs of die 202 and member 213 are similar, e.g., within 2x, an epoxy, gold eutectic or solder may be used to join the two components. Attachment is not necessary as long as heat dissipation member 213 is sufficiently engaged with surface 204 of die 202 to enable heat transfer to occur.

Figure 3:
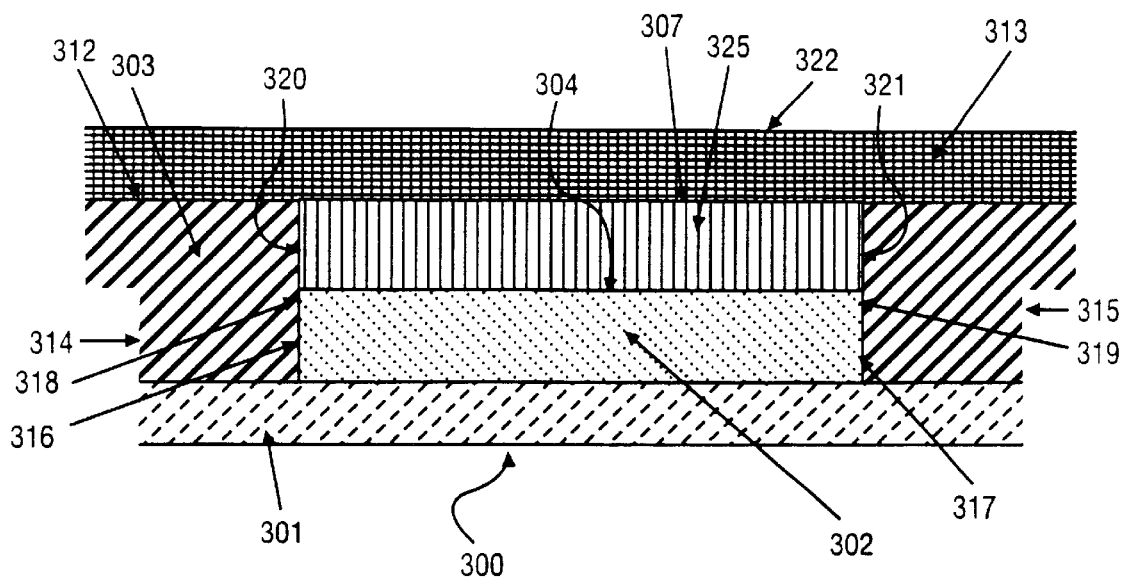
FIG. 3 represents a cross-section of a second embodiment of the semiconductor device of the present invention.

In a second embodiment of the present invention, represented by FIG. 3, molding compound 303 is thicker than die 302. First portions 316, 317 of first and second sides 318, 319 of molding compound 303 contact die 302; whereas, second portions 320, 321 do not. In addition, unlike the device shown in FIG. 2, heat dissipation member 313 contacts both die 302's top surface 304 and second portions 320, 321.

In this second embodiment of the present invention, heat dissipation member 313 preferably comprises heat conductor 325, which has a thickness approximately equal to the thickness of second portions 320, 321, and heat spreader or heat sink 322, which contacts heat conductor 325 and surface 312 of molding compound 303. As shown, heat spreader/sink 322 is longer than the distance between first end 314 and second end 315 of molding compound 303.

To form device 300, heat conductor 325 may be placed on top of die 302 either before or after molding compound 303 is applied. When molding compound 303 is applied prior to coupling heat conductor 325 to die 302, the mold will include a boss or pedestal that prevents the molding compound from reaching die 302. When molding compound 303 is applied after coupling heat conductor 325 to die 302, a substantially flat mold, which can engage the surface of conductor 325 during the molding compound application step, can be used. Either way, substantially none of molding compound 303 should reach top surface 304 of die 302 or top surface 307 of heat conductor 325. Conductor 325 should be bonded to die 302 using a high conductivity adhesive, for example, a gold eutectic or a thermal epoxy.

Heat conductor 325 enables heat transfer from die 302 to heat spreader/sink 322. Preferably, heat conductor 325 has a relatively high thermal conductivity, and a CTE that is greater than about one-half and less than about double the CTE of die 302. Materials for forming conductor 325 that may provide such properties include silicon, molybdenum, and aluminum silicon carbide ("AlSiC") with a CTE close to that of silicon. Like the first embodiment described above, heat spreader/sink 322 can be made from copper or aluminum and should not be mechanically rigid to avoid possible thermal mismatch stresses that could result from such rigid attachment.

Figure 4:
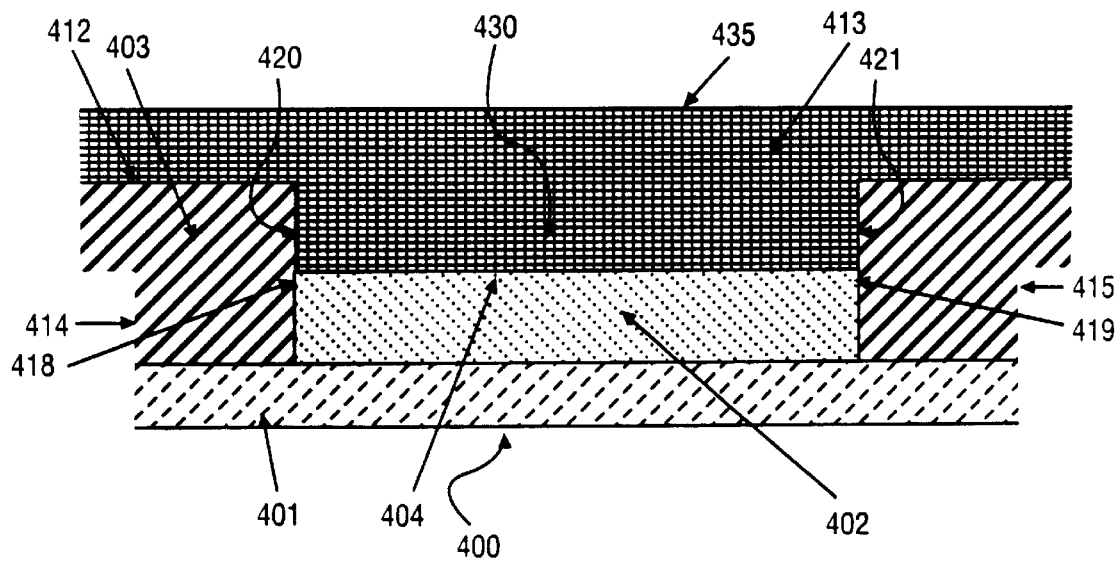
FIG. 4 represents a cross-section of a third embodiment of the semiconductor device of the present invention.

In a third embodiment of the present invention, represented by FIG. 4, molding compound 403 is thicker than die 402—as in the embodiment described above in connection with FIG. 3. Unlike that other embodiment, however, heat dissipation member 413 is a single integrated piece of metal that contacts die 402, sides 418, 419 of molding compound 403, and surface 412 of molding compound 403. Portion 430 of heat dissipation member 413, which contacts top surface 404 of die 402 and sides 418, 419 of molding compound 403, has approximately the same thickness as the length of portions 420, 421 of sides 418, 419. Like the embodiments described earlier, portion 435 of heat dissipation member 413, which contacts surface 412 of molding compound 403, is longer than the distance between first end 414 and second end 415.

To make device 400, a cavity may be created during molding. Heat dissipation member 413 is then shaped so that portion 430 fits into that cavity, enabling that portion to contact die 402. Like the other embodiments described above, member 413 should not be mechanically rigid to avoid possible thermal mismatch stresses.

In each embodiment described above, those skilled in the art will appreciate that conventional techniques may be applied to form the multilayer laminate and to attach the die to it. Depending upon the desired structure, molds of varying shape may be used to define the region where the molding compound will be formed, and the region from which it will be excluded. A flat mold may be preferred (e.g., for the FIGS. 2 and 3 embodiments) or, alternatively, a mold having an appropriately shaped boss or pedestal (e.g., for the FIG. 4 embodiment) may be preferred. As an alternative to using a flat mold when applying the molding compound to the device, the molding compound may be deposited over the entire device, then polished back until it is removed from the surface of the die (FIG. 2), or the heat conductor (FIG. 3).

An improved semiconductor device that includes COF packaging has been described. That device provides improved thermal conductivity and eliminates the thermal mismatch of current COF packaged devices. By ensuring that the molding compound does not contact the back side of the die, heat can be more efficiently transferred from the die and high stress and warpage may be avoided.

Features shown in the above referenced drawings are not intended to be drawn to scale, nor are they intended to be shown in precise positional relationship. Additional features that may be included in the above described semiconductor device have been omitted as they are not useful to describe aspects of the present invention.

Although the foregoing description has specified a semiconductor device that includes a specific type of packaging structure, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A semiconductor device comprising:
   a multilayer laminate that includes a thermally stable, flexible polymer film, the laminate having a top surface and a bottom surface;
   a semiconductor die having a top surface and a bottom surface, the die's bottom surface contacting the laminate's top surface, and having substantially vertical sides oriented substantially perpendicular to the die's top and bottom surfaces;
   a molding compound contacting both the laminate's top surface and the sides of the die, but not the die's top or bottom surfaces, the molding compound having a first surface that contacts the laminate and a second surface and having sides oriented substantially perpendicular to the molding compound's first and second surfaces, a first portion of those sides contacting the die and a second portion of those sides not contacting the die; and
   a heat dissipation member that comprises:
      a heat conductor having a thickness approximately equal to the thickness of the second portion of the sides of the molding compound, comprising a material selected from the group consisting of silicon, molybdenum, and aluminum silicon carbide, and contacting substantially all of the die's top surface, and
      a heat spreader, having a surface area exceeding the molding compound's surface area, that contacts the heat conductor and the second surface of the molding compound and that comprises a material selected from the group consisting of copper and aluminum.

2. The semiconductor device of claim 1 wherein the film comprises a polyimide.

3. The semiconductor device of claim 1 wherein the molding compound comprises an epoxy, and wherein the heat conductor is bonded to the die using a high conductivity adhesive that comprises a gold eutectic.

4. The semiconductor device of claim 1 further comprising a plurality of solder balls that are attached to the laminate's bottom surface.

5. A flip chip-on-flex integrated circuit assembly comprising:
   a multilayer laminate that includes a thermally stable, flexible polymer film;
   a semiconductor die having an active surface and an inactive surface, the active surface including a plurality of contacts;
   a molding compound contacting both the laminate and the die, but not contacting the die's active or inactive surfaces, the molding compound having a first surface that contacts the laminate and a second surface and having sides oriented substantially perpendicular to the molding compound's first and second surfaces, a first portion of those sides contacting the die and a second portion of those sides not contacting the die; and
   a heat dissipation member that comprises:
      a heat conductor having a thickness approximately equal to the thickness of the second portion of the sides of the molding compound and a coefficient of thermal expansion that is greater than about one-half and less than about double the coefficient of thermal expansion of the die, the heat conductor contacting the die's inactive surface, and
      a heat spreader, having a surface area exceeding the molding compound's surface area, that contacts the heat conductor and the second surface of the molding compound and that comprises a material selected from the group consisting of copper and aluminum.

6. The flip chip-on-flex integrated circuit assembly of claim 5 further comprising a plurality of solder balls that are attached to the laminate.

7. A semiconductor device comprising:
   a multilayer laminate that includes a thermally stable, flexible polymer film, the laminate having a top surface and a bottom surface;
   a semiconductor die having a top surface and a bottom surface, the die's bottom surface contacting the laminate's top surface, and having substantially vertical sides oriented substantially perpendicular to the die's top and bottom surfaces;
   a molding compound, having a first surface that contacts the laminate's top surface and a second surface, the molding compound contacting the sides of the die, but not the die's top or bottom surfaces, and having sides oriented substantially perpendicular to the molding compound's first and second surfaces, a first portion of those sides contacting the die and a second portion of those sides not contacting the die; and
   a heat dissipation member that includes a heat conductor that contacts substantially all of the die's top surface, and a heat spreader that contacts the heat conductor and the molding compound's second surface,
   wherein the heat conductor has a coefficient of thermal expansion that is greater than about one-half and less than about double the coefficient of thermal expansion of the die, and wherein the heat spreader comprises a material selected from the group consisting of copper and aluminum and has a surface area that exceeds the molding compound's surface area.

\* \* \* \* \*